(12) United States Patent
Wong et al.

(10) Patent No.: US 8,906,768 B2
(45) Date of Patent: Dec. 9, 2014

(54) WRAP AROUND STRESSOR FORMATION

(71) Applicant: GLOBALFOUNDRIES, Inc., Grand Cayman (KY)

(72) Inventors: Hoong Shing Wong, Clifton Park, NY (US); Min-hwa Chi, Malta, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/840,692

(22) Filed: Mar. 15, 2013

(65) Prior Publication Data

US 2014/0264489 A1    Sep. 18, 2014

(51) Int. Cl.
*H01L 29/775* (2006.01)
*H01L 29/66* (2006.01)
*H01L 29/78* (2006.01)

(52) U.S. Cl.
CPC ........ *H01L 29/785* (2013.01); *H01L 29/66795* (2013.01)
USPC ............................ 438/285; 438/157; 438/479

(58) Field of Classification Search
CPC ............ H01L 29/785; H01L 29/66795; H01L 29/7849
USPC .................................. 257/288, 285, 157, 479
See application file for complete search history.

(56) References Cited

U.S. PATENT DOCUMENTS

| 7,439,109 | B2 * | 10/2008 | Anderson et al. | 438/150 |
| 7,939,413 | B2 * | 5/2011 | Chong et al. | 438/300 |
| 2012/0138886 | A1 * | 6/2012 | Kuhn et al. | 257/9 |
| 2012/0171832 | A1 * | 7/2012 | Toh et al. | 438/300 |

OTHER PUBLICATIONS

Meikei Ieong et. al., "Transistor scaling with novel materials," Materials Today, Jun. 2006, pp. 26-31, vol, 9.
Scott Thompson et. al., "A Logic Nanotechnology Featuring Strained-Silicon," IEEE Electron Device Letters, Apr. 2004, pp. 191-193, vol. 25, No. 4.
B.J. Ginsberg et. al., "Selective epitaxial growth of silicon and some potential applications," IBM J. Res. Develop., Nov. 1990, pp. 816-827, vol. 34, No. 6.
C. Auth et. al., "A 22nm High Performance and Low-Power CMOS Technology Featuring Fully-Depleted Tri-Gate Transistors, Self-Aligned Contacts and High Density MIM Capacitors," IEEE Symposium on VLSI Technology Digest of Technical Papers, 2012, pp. 131-132.
K. Mistry et. al., A 45nm Logic Technology with High-k+ Metal Gate Transistors, Strained Silicon, 9 Cu Interconnect Layers, 193nm Dry Patterning, and 100% Pb-free Packaging, IEEE, 2007, pp. 247-250.

* cited by examiner

*Primary Examiner* — Zandra Smith
*Assistant Examiner* — Damian A Hillman
(74) *Attorney, Agent, or Firm* — Heslin Rothenberg Farley & Mesiti P.C.; George S. Blasiak

(57) ABSTRACT

For the formation of a stressor on one or more of a source and drain defined on a fin of FINFET semiconductor structure, a method can be employed including performing selective epitaxial growth (SEG) on one or more of the source and drain defined on the fin, separating the fin from a bulk silicon substrate at one or more of the source and drain, and further performing SEG on one or more of the source and drain to form a wrap around epitaxial growth stressor that stresses a channel connecting the source and drain. The formed stressor can be formed so that the epitaxial growth material defining a wrap around configuration connects to the bulk substrate. The formed stressor can increase mobility in a channel connecting the defined source and drain.

20 Claims, 8 Drawing Sheets

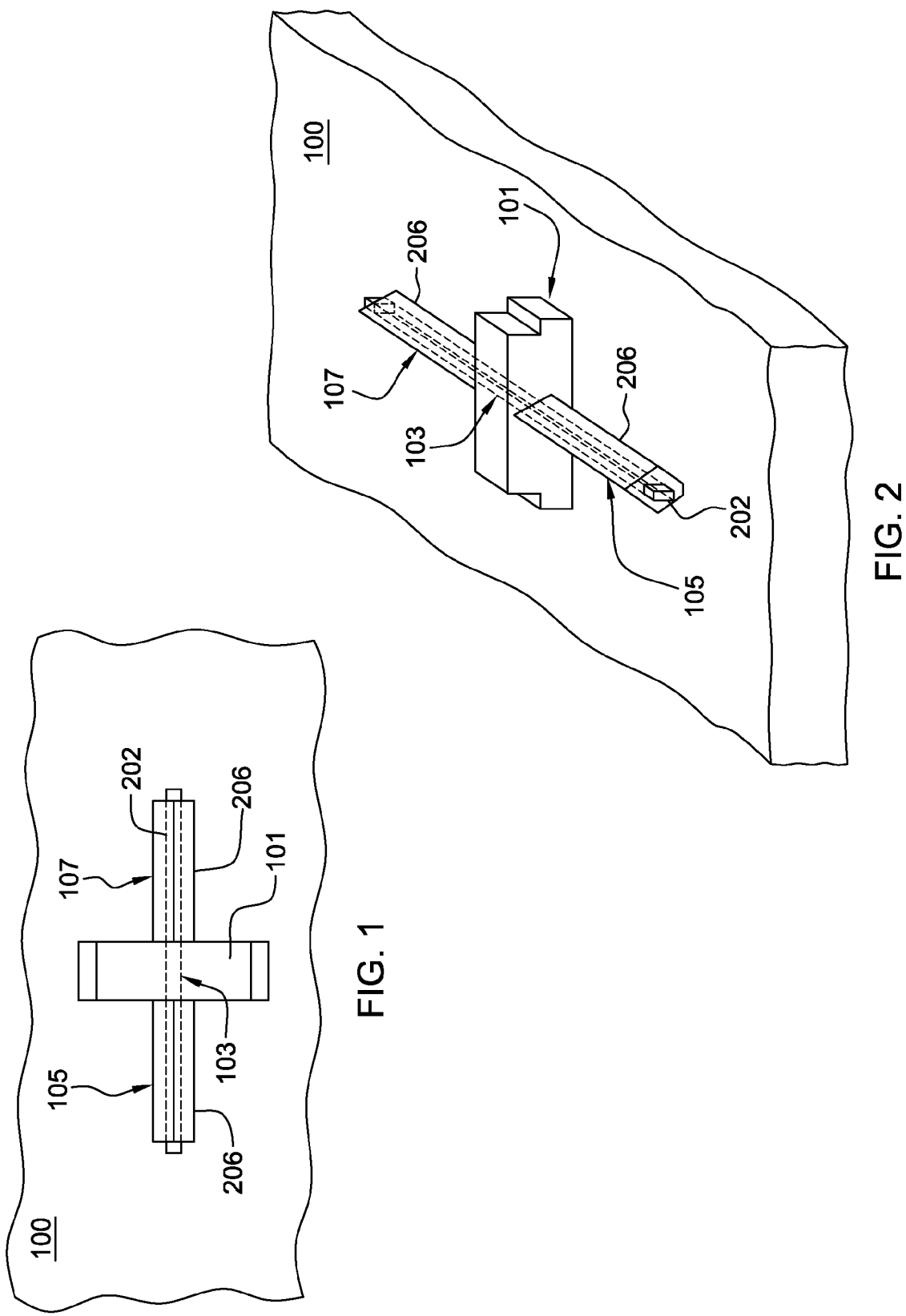

WRAP AROUND STRESSOR FORMATION

FIELD OF THE INVENTION

The present invention generally relates to semiconductor devices and methods of fabricating semiconductor devices, and more particularly, to methods of formation of a stressor during bulk FINFET fabrication.

BACKGROUND OF THE INVENTION

In contrast to traditional planar metal-oxide-semiconductor, field-effect transistors (MOSFETs), which are fabricated using conventional lithographic fabrication methods, non-planar FETs incorporate various vertical transistor structures. One such semiconductor structure is the "FINFET", which takes its name from the multiple semiconductor "fins" that are used to form the respective gate channel with small footprint. Advantageously, the fin structure helps to control current leakage through the transistor in the off stage, and a double gate or tri-gate structure may be employed to control short channel effects.

BRIEF SUMMARY

For the formation of a stressor on one or more of a source and drain defined on a fin of FINFET semiconductor structure, a method can be employed including performing selective epitaxial growth (SEG) on one or more of the source and drain defined on the fin, separating the fin from a bulk silicon substrate at one or more of the source and drain, and further performing SEG on one or more of the source and drain to form a wrap around epitaxial growth stressor that induces stress in a channel connecting the source and drain. The formed stressor can be formed so that the epitaxial growth material defining a wrap around configuration connects to the bulk substrate. The formed stressor can increase mobility in a channel connecting the defined source and drain.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 1 is a top plan view of one embodiment of a conventional FINFET;

FIG. 2 is an isometric view of the FINFET of FIG. 1;

DETAILED DESCRIPTION

Figure 3:
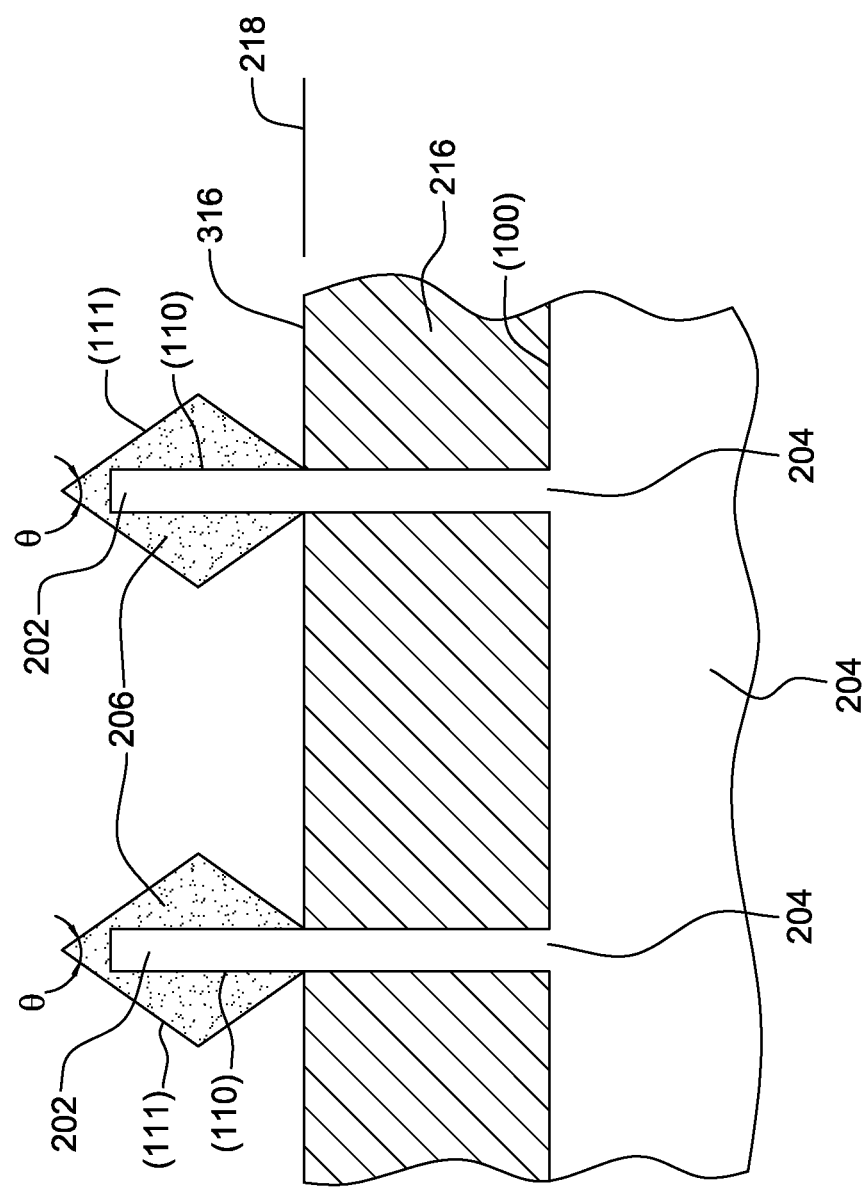
FIG. 3 illustrates an aspect of a wrap around stressor formation process wherein epitaxial growth material (epi) is grown on a fin.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

FIGS. 1 and 2 show a top plan view and isometric view, respectively, of a typical FINFET 100 fabricated on Si substrate. In the embodiment illustrated, FINFET 100 includes a gate 101 which is wrapped around the top and sides of a fin 202. A source 105 is defined at one end of fin 202, and a drain 107 is defined at the other end of fin 202. Source 105 and drain 107 can be defined on fin 202 by performing appropriate implantation processes which may be performed prior to, subsequently to, or contemporaneously with epitaxially growth processes as set forth herein. Appropriate implantation processes can include implantation of dopants (n-type or p-type) for n-type and p-type FinFETs. A channel 103 can be defined by fin 202 intermediate source 105 and drain 107 at a region of fin 202 covered by gate 101. Gate 101 in one embodiment can comprise a gate stack having multiple layers. The multiple layers can include one or more metal layers and one or more dielectric layers. The one or more metal layers can comprise, e.g., one or more of titanium nitride (TiN), aluminum (Al), or tungsten (W). The one or more dielectric layers can comprise, e.g., one or more of Si-oxide, Si-nitride, or high-k material (e.g. Hf-oxide).

As is set forth herein wrap around stressors comprising epitaxial growth material 206 can be formed at one or more of a source 105 and drain 107 of a semiconductor device. Prior to, subsequently to contemporaneously with the formation of gate 101, appropriately doped wrap around stressors as set forth herein can be formed and can serve as extensions of source 105 and drain 107. Typically, a wrap around stressor is formed with compression stress for p-type FINFETs, and tensile stress for n-type FINFETs. A wrap around stressor comprising epitaxial growth material 206 as set forth herein can be formed to wrap around 360 degrees of fin 202 in an area or areas of fin 202 defining one or more of a source 105 and drain 107.

With reference to FIGS. 3-8 there is set forth a method comprising performing selective epitaxial growth (SEG) on one or more of a source and drain defined on a fin 202 extending from a bulk silicon substrate 204, separating the fin from the bulk silicon substrate at one or more of the source and drain, and further performing SEG on one or more of the source and drain to form a wrap around epitaxial growth material stressor that stresses one or more of the source and drain area. The formed stressor can be formed so that the epitaxial growth material connects to the bulk substrate 204. The formed stressors can induce stress (tensile or compressive) and increase electron or hole mobility respectively in a channel connecting the defined source and the drain.

Referring to the Figures more particularly there is set forth in FIG. 3 a depiction of the performance of an initial selective epitaxial growth (SEG) on source and drain areas (S/D) defined on a fin 202 extending from a bulk silicon substrate 204. By performance of an initial SEG, epitaxial growth material 206 can grow to define a diamond shape formation as is indicated in FIG. 3 about depicted source and drain (S/D) areas of fin 202.

The initial SEG material as depicted in FIG. 3 can comprise, e.g., Si (with e.g., 1.0-2.0% carbon doping for tensile stress) or SiGe (with e.g., 10.0-50.0% Ge doping for compressive stress) SEG. The initial SEG can comprise an epitaxial growth range of 10.0-30.0 nm. With the initial SEG performed, epitaxial growth material formed on fins 202 extending from bulk silicon substrate 204 can define a diamond shape surface (111) as shown in FIG. 3 having a characteristic cross sectional angle, Θ, between two adjoining Si crystal surfaces (111). As shown in FIG. 3, an initial SEG in one embodiment can continue until surface defined by epitaxial growth material 206 defines an angle of 70.6 (35.3×2) degrees. When an initial SEG process is terminated the surface (111), defined by epitaxial growth material 206 can be, as depicted in FIG. 3, in non-contacting relation with a neighboring wrap around stressor defined by epitaxial growth material 206 wrapped around fin 202 without contacting surface (111) of neighboring wrap around stressor defined by material 206. In the particular embodiment as set forth in FIG. 3, an initial SEG can terminate when epitaxial growth material 206 growing from a sidewall surface (110) of fin 202 reaches surface (111) surface defining a neighboring wrap around stressor formation. In another embodiment, an initial growth of epitaxial growth material 206 can be terminated prior to epitaxial growth material 206 reaching surface (111).

Figure 4:
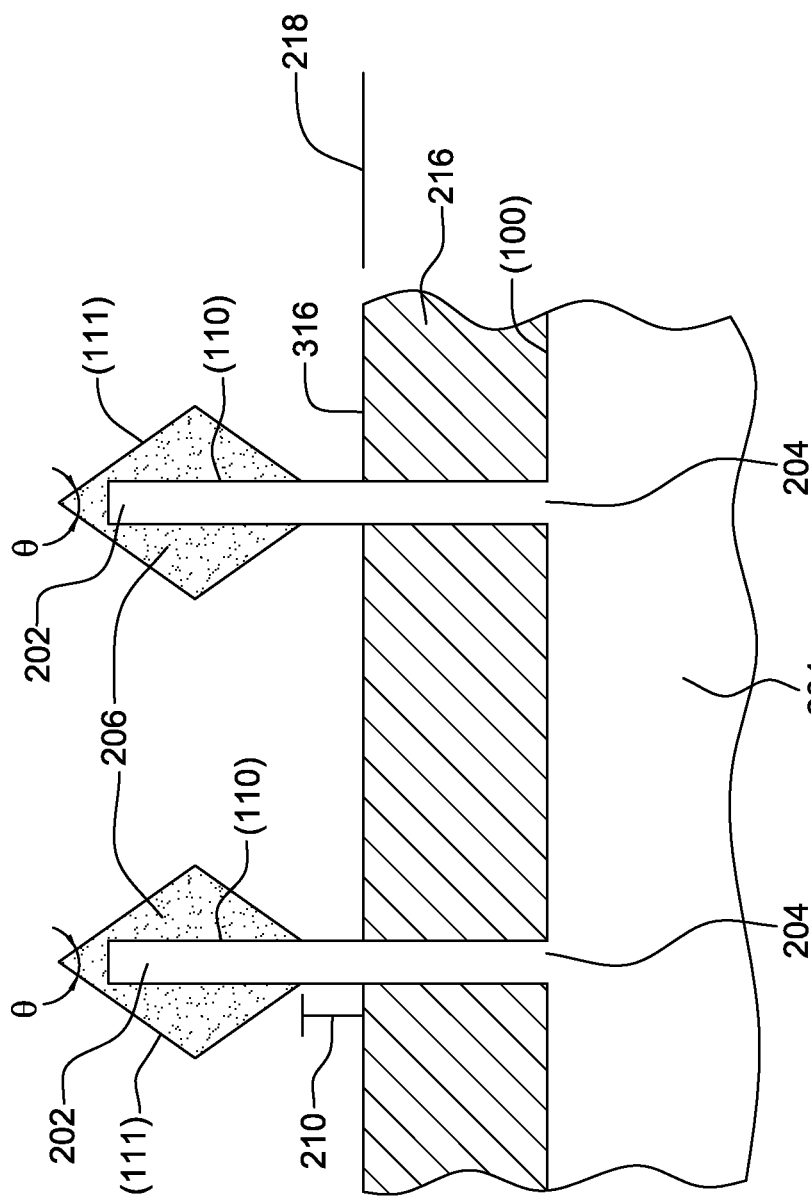
FIG. 4 illustrates an aspect of a wrap around stressor formation process wherein epitaxial growth material (epi) is grown on a fin.
Figure 5:
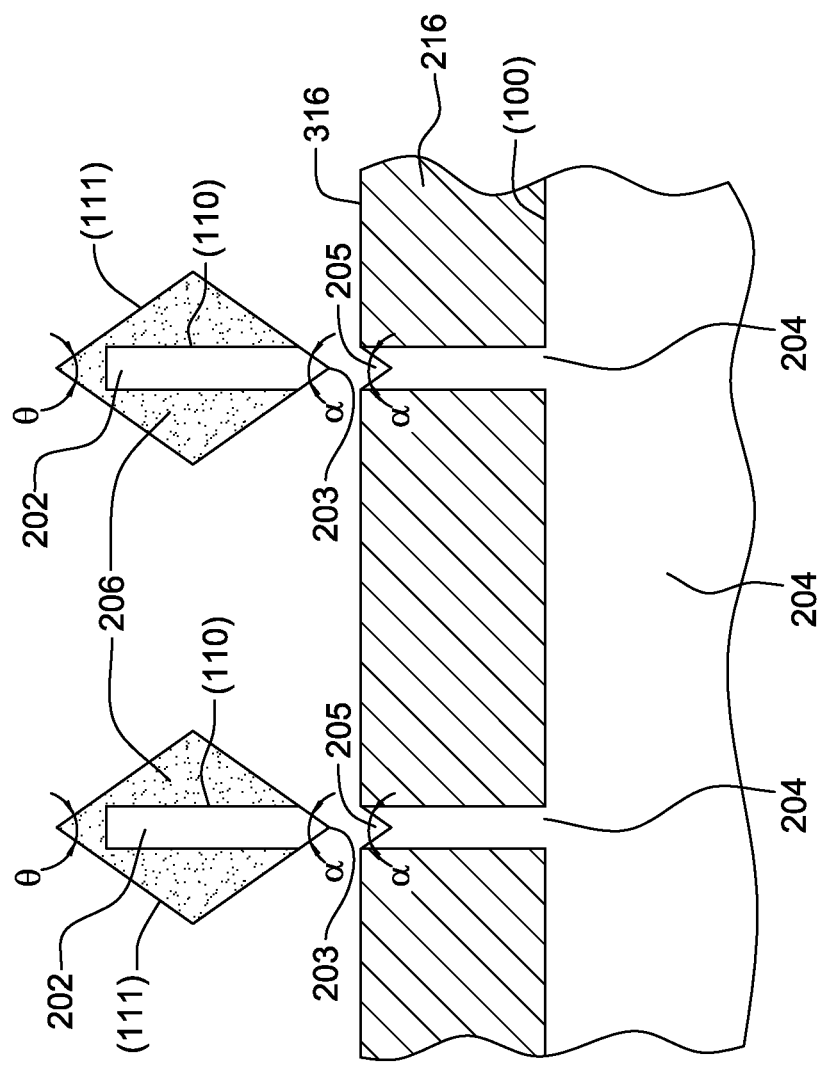
FIG. 5 illustrates an aspect of a wrap around stressor formation process wherein a fin is separated from a bulk silicon substrate.

On termination of an initial SEG process, a fin 202 can be separated from a bulk silicon substrate 204 at one or more of a source and drain. Such separating can be performed without separating fin 202 from bulk silicon substrate 204 at a region below gate 101. A separation of fin 202 from bulk silicon substrate 204 as depicted in FIGS. 4 and 5 can comprise one or more and in one embodiment two etching processes. Initially, wet or dry etching can be performed for removal of oxide 216. Etching for removal of oxide 216 is depicted in FIG. 4 so that the sidewall surface (110) of fins 202 is exposed. Oxide layer 216 having surface 316 at a surface elevation 218 can be etched using e.g., wet HF dip, or plasma F-chemistry to etch for material removal in the range of e.g., 5.0-20.0 nm.

The initial SEG in one embodiment is continued so that epitaxial growth material 206 reaches both oxide 216 and surface (111) defining a neighboring wrap around stressor defined by epitaxial growth material 206 delimited by surface (111). Accordingly, oxide 216 can be removed to expose a small portion of the fin sidewall adjacent to the oxide 216. Oxide etching can be performed to define a gap 210 (e.g., 5.0-20.0 nm in one embodiment) between surface (111) and the newly defined top elevation 218 of the layer defined by oxide 216. With oxide 216 removed or gap 210 otherwise defined to expose a sidewall surface (110) of fin 202, then wet etching can be performed to etch material, e.g. silicon (Si) defining fin 202. An etching away of material defining fin 202 is depicted in FIG. 5. In one embodiment the separating (of fin 202) can be performed using anisotropic wet etching. In one embodiment the separating can be performed using anisotropic wet Si-etching (preferential faster etching on Si surface (110) and >10× slower etching on surface (111) surface defined by epitaxial growth material 206. Si wet etching will not result in oxide being etched away. The anisotropic wet Si-etching can comprise e.g., TMAH or KOH or Nh4OH wet Si-etching. With anisotropic wet Si-etching, an etch rate of epitaxial growth material 206 can be >10× slower on surface (111) than an etch rate of material (Si) defining a sidewall surface (110) of fin 202. Accordingly, with anisotropic wet Si-etching causing bottom area of fin 202 to be removed at a faster rate, so that the slower etched surface (111) is extended into a V-shape at the bottom of the diamond shape as depicted in FIG. 5. Surface (111) may be etched only an insignificant amount. Similarly, as is also depicted in FIG. 5, a small area of bulk silicon substance 204 can be etched and V-shaped cavities 205 can be formed due to the surface (111) developing during the wet etch process. V-shaped points 203 and V-shaped cavities 205 in one embodiment, can define an angle, α of α=70.6 degrees, the same angle as the angle Θ, the angle defined by adjacent epitaxial growth surfaces (111).

Because the described etching can be performed without etching in a gate and channel area 101 and 103 (FIGS. 1 and 2) fin 202 (with fin 202 separate from bulk silicon substrate 204) at one or more of a source 105 and drain 107 can remain in an un-separated (connected) state in area of channel 103 below gate 101.

The initial SEG process and etching can be controlled so that targeted geometries for source and drain areas (S/D) are achieved. In the development of methods set forth herein it was observed that exposed fin material on a sidewall of fin 202, namely, the sidewall surface (110) will be removed substantially at the onset of wet etching. The wet etching in one embodiment can preferentially attack a sidewall surface (110) of fin 202 while very slowly attacking surface (111) defined by epitaxial growth material 206 (e.g. anisotropic wet etching has >10× slower etch rate on an epitaxial growth surface (111) than on fin sidewall surface (110) or bulk silicon (Si) substrate surface (100). Accordingly, the surface (111) defined by epitaxial growth material 206 can retain its dimensions with negligible loss of material. In one embodiment, a top angle Θ of 2×35.3 (70.6) degrees and side angle 2×54.7 (109.4) degrees can be maintained throughout the fin separation process.

Figure 6:
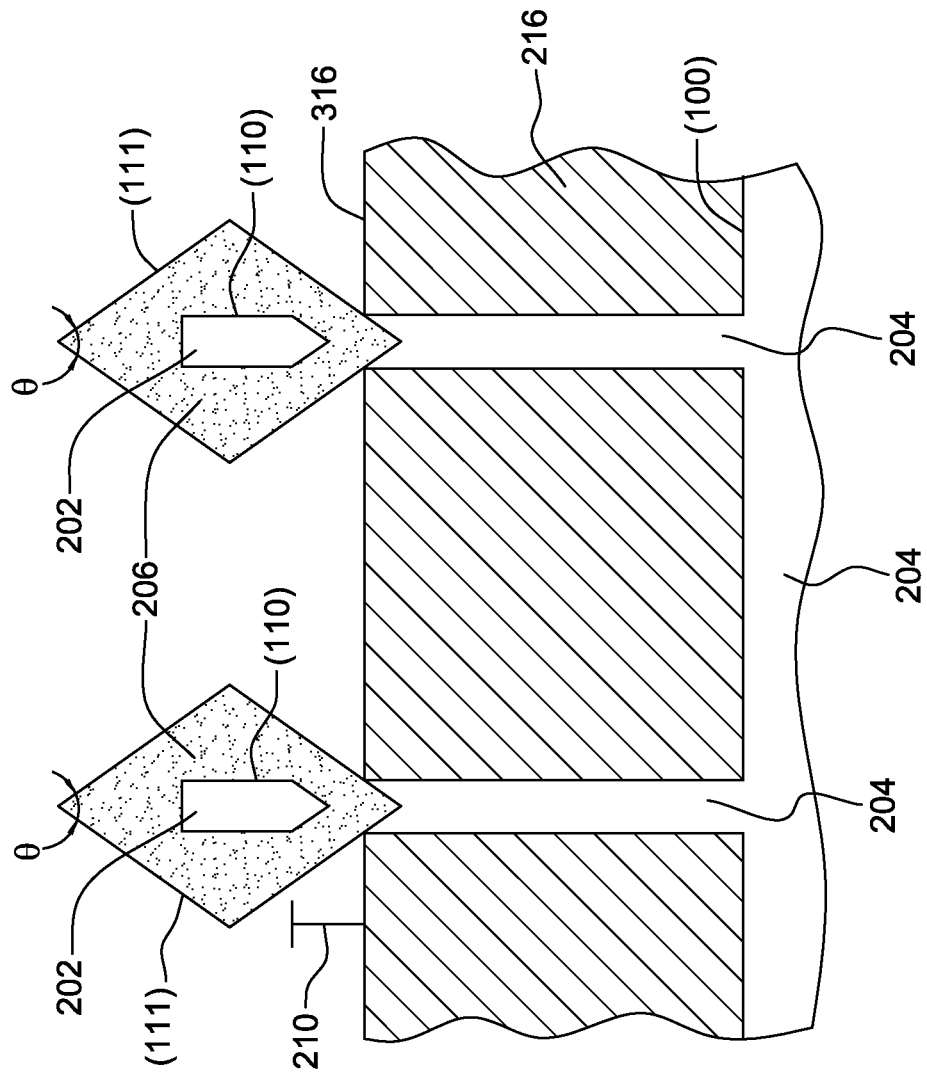
FIG. 6 illustrated an aspect of a wrap around stressor formation process wherein epitaxial growth material (epi) is grown after separating.

Referring to FIG. 6, there is set forth a depiction of further performing SEG. The further performing SEG can include further performing SEG until epitaxial growth material grown about the depicted S/D area of fin 202 wraps around fin 202 as shown in FIG. 6. In one embodiment, the further performing selective epitaxial growth process can be terminated prior to epitaxial growth material 206 reaching bulk silicon (Si) substrate 204. In one embodiment the further performing selective epitaxial growth process can be continued until material 206 defining the depicted wrap around configuration connects to substrate 204. A wrap around stressor comprising epitaxial growth material 206 and delimited by surface (111) as set forth herein can be formed to wrap around 360 degrees of fin 202 in an area or areas of fin 202 defining one or more of a source 105 and drain 107. In the case of a fin 202 having a polygon cross section, a 360 degree wrap around stressor comprising epitaxial growth material 206 can wrap around each of a top bottom and sides of a fin 202 as is shown in FIGS. 2, 6, 7 and 8 (the two legs of the "V" defining a bottom of a fin 202 as shown in FIGS. 6, 7 and 8).

The wrap around formation, wherein epitaxial growth material 206 wraps around fin as shown in FIG. 6 imparts stress to channel 103 as depicted in FIG. 2. The wrap around formation can result in increased channel stress and enhanced mobility. A stress and mobility enhancement is provided not only by the wrap around configuration but is further enhanced by the connection of the wrap around epitaxial growth material 206 as depicted in FIG. 6 to bulk silicon (Si) substrate 204. A connection of epitaxial growth material 206 to substrate 204 further increases a stress in channel 103 due to the mismatch of lattice between SEG material 206 and the Si substrate 204. In the embodiment of FIG. 6, the depicted epitaxial growth material 206 of successive fins is un-merged. SEG material 206 can be SiGe (in-situ B doped) for p-MOS to hole mobility enhancement by the induced compressive stress at channel; or Si:C (with in-situ P or As doped) for electron mobility enhancement by the induced tensile stress in channel 103. The selection of epitaxial growth material can influence mobility enhancement. In the embodiment of FIG. 6, epitaxial growth material 206 of adjacent fins is not merged. Merged fins can be provided with reduced selective epitaxial growth by narrowing a spacing between fins 202, e.g. in the case there is fabricated an SRAM device.

Figure 7:
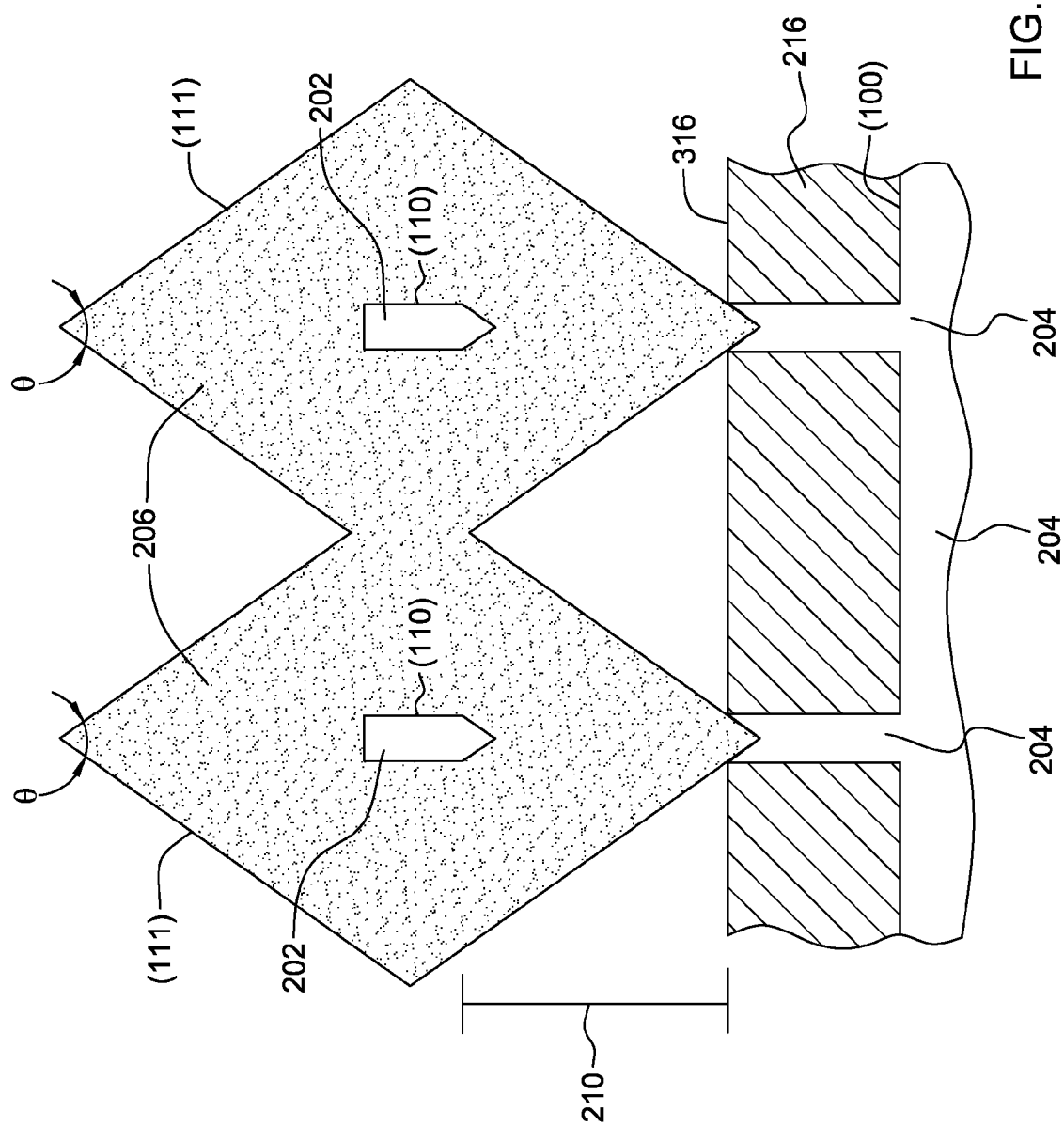
FIG. 7 illustrated an aspect of a wrap around stressor formation process wherein epitaxial growth material (epi) is grown after separating in the formation of a merged fin.
Figure 8:
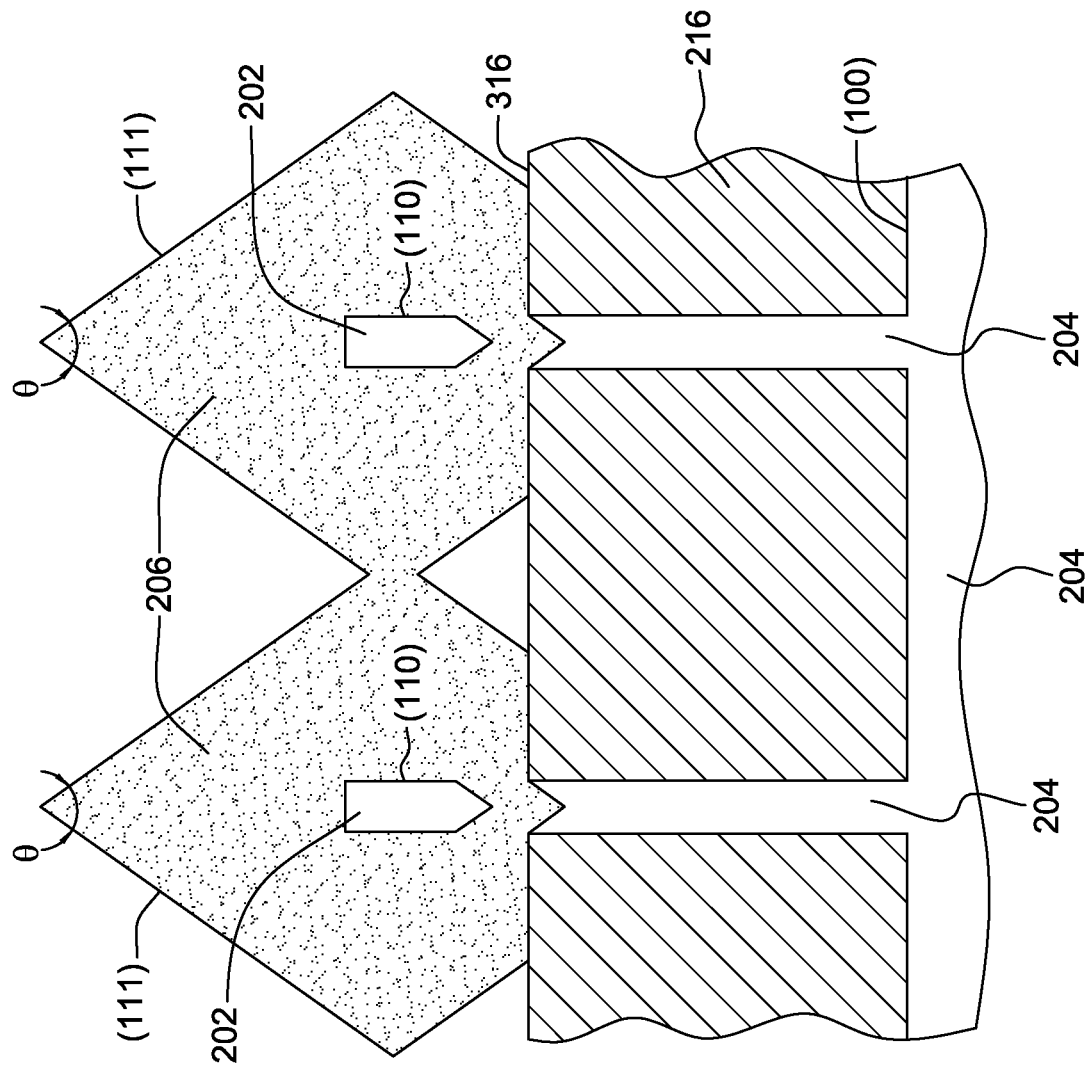
FIG. 8 illustrated an aspect of a wrap around stressor formation process wherein epitaxial growth material (epi) is grown after separating in the formation of a merged fin.

Referring to FIG. 7, there is set forth a depiction of further performing SEG to form merged fins. The epitaxial growth material 206 can be merged in the manner depicted in FIG. 7 for fabrication of various devices, e.g., devices requiring a large drive current. The merged fin S/D embodiment as set forth in FIG. 7 not only maintains stress level but also reduces electrical resistance. With a non-wrap around stressor configuration (e.g. a configuration where the wrap around is a "broken" wrap around of less than 360 degrees), stress strength can be degraded if fins are merged for lower resistance. If wrap around stressors according to the embodiment of FIG. 7 are merged electrical resistance can be lowered while stress strength is maintained. FIG. 8 illustrates an aspect of a wrap around stressor formation process in another embodiment wherein epitaxial growth material (epi) is grown after separating in the formation of a merged fin. Comparing the embodiment of FIG. 8 to FIG. 7, there is comparatively lower fin 202 and less oxide 216 removed in the embodiment of FIG. 8 than in the embodiment of FIG. 7. Thus, the total amount of SEG materials 206 on an area of fin 202 defining source 105 and drain 107 can be adjusted by the fin height and the oxide 216 recess. The amount of oxide recess is less in the embodiment of FIG. 8 than in FIG. 7 in order to adjust the total stress and electrical resistance of one or more of a source 105 and drain 107. After a further epitaxial growth process results in epitaxial growth material 206 reaching oxide 216 the epitaxial growth material 206 may nevertheless be grown generally laterally until epitaxial growth material surfaces (111) of neighboring wrap around stressors contact one another.

Figure 9:
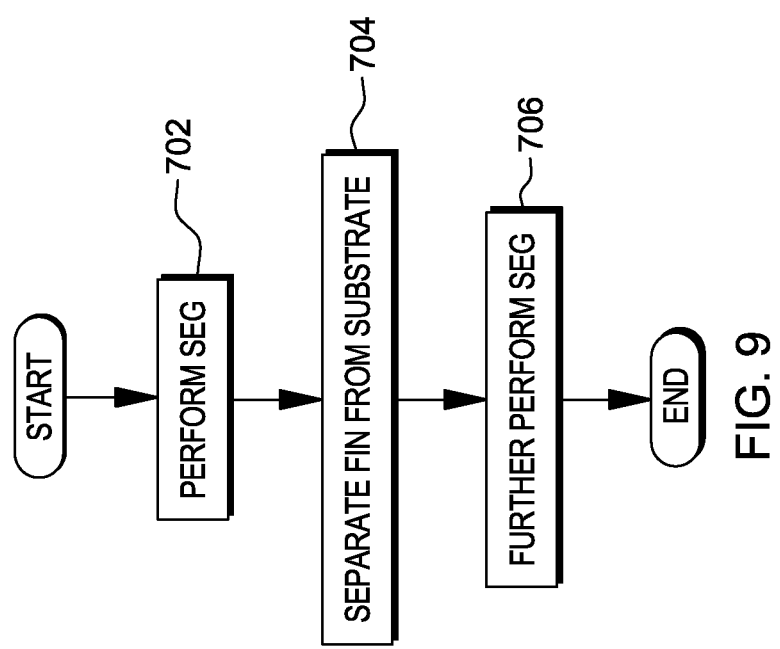
FIG. 9 is a flow diagram illustrating a wrap around stressor formation process in one embodiment.

Referring to FIG. 9, a method is depicted. At block 702 performing selective epitaxial growth (SEG) can be performed on one or more of a source and drain defined on a fin 202 extending from a bulk silicon substrate 204. At block 704, a fin can be separated from the bulk silicon substrate at one or more of the source and drain. At block 706 SEG can be further performed on one or more of the source and drain defined by fin 202 to form a wrap around epitaxial growth stressor comprising epitaxial growth material 206 that stresses the source and drain and induces strain in the channel. The formed stressor can be formed so that the epitaxial growth material connects to the bulk silicon (Si) substrate 204. The formed stressor which can feature in one aspect a wrap around configuration and in another aspect a connection to a bulk silicon (Si) substrate 204 can increase stress and mobility in a channel connecting a source and drain defined by a fin 202.

The structure of FIG. 3 prior to the SEG can be formed in accordance with appropriate process flows. After the fins are formed (i.e. etched, gap-filled, and CMP planarized), the fins 202 are revealed to desired height (~25-50 nm) by recessing the STI oxide 216. Then the process continues with n/p well formation. Then the gate stack including dielectric layers and gate electrode layers defining gate 101 (FIG. 1 and FIG. 2) are deposited, patterned, and etched; after spacers are formed along gate stack defining gate 101, the source 105 and drain 107 are exposed and ready for epi-growth (SEG) According to the initial SEG process, epitaxial growth material (Si, SiGe, . . . etc.) can grow on exposed Si surfaces but not on oxide surfaces. In the process of epitaxial growth, different SEG materials can be utilized (e.g., III-V, or II-VI materials). Regarding further aspects of an epitaxial growth process, epitaxial growth rate can be controlled by process temperature, pressure, gas flow rate, and time. The initial partial SEG can grow a fin 202 fatter (into a diamond shape bounded by the surface (111)) with protected epitaxial material 206. This is not only provides larger source/drain area for lower electrical resistance and better contact, but also it provides useful stress to induce channel stress for mobility enhancement. Furthermore, the expanded fin 202 with diamond shape defined by surface (111) can also facilitate a method to separate by wet etching when a portion of a fin (Si) removed during fin separating (block 704, FIG. 9). If the initial SEG process is terminated prematurely before the epitaxial growth material 206 defines surface (111) so that surface (111) defines a diamond shape then the wet etching for separation of fin 202 can also etch away the SEG material 206. Where the initial SEG is continued so that surface (111) defines a diamond shape wet etching for the separation of fin 202 will not etch away SEG material (111) by a statistically significant. Accordingly, surface (111) can be regarded as being self-limiting where the initial SEG is continued so that surface (111) defines a diamond shape.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
performing selective epitaxial growth (SEG) on one or more of a source or drain defined on a fin extending from a bulk silicon substrate of a FINFET semiconductor device;
with the fin remaining connected to the bulk silicon substrate at an area of a channel connecting the source and drain, separating the fin from the bulk silicon substrate at one or more of the source or drain; and
further performing SEG on one or more of the source or drain to form a wrap around epitaxial growth stressor that stresses the channel connecting the source and drain.

2. The method of claim 1, wherein the further performing SEG includes further performing the SEG so that the epitaxial growth stressor connects to the bulk silicon substrate.

3. The method of claim 1, wherein the epitaxial growth stressor comprises Si.

4. The method of claim 1, wherein the epitaxial growth stressor comprises one or more of SiGe and SiC.

5. The method of claim 1, wherein the separating comprises using an anisotropic wet Si-etching method.

6. The method of claim 1, wherein the performing includes terminating the performing after an epitaxial growth material surface of a diamond shape is defined on a fin.

7. The method of claim 1, wherein the performing includes terminating the performing when selective epitaxial growth material reaches an epitaxial growth surface of a neighboring wrap around stressor.

8. The method of claim 1, wherein the further performing SEG includes further performing SEG so that the epitaxial growth stressor merges with an epitaxial growth stressor at a neighboring fin.

9. The method of claim 1, wherein the separating includes etching for removal of oxide of an oxide layer over the bulk silicon substrate and etching for removal of material defining the fin.

10. The method of claim 1, wherein the method includes doping the wrap around epitaxial growth stressor so that the wrap around epitaxial growth stressor induces compressive stress in the channel.

11. The method of claim 1, wherein the method includes doping the wrap around epitaxial growth stressor so that the wrap around epitaxial growth stressor induces tensile stress in the channel.

12. The method of claim 1, wherein the performing includes terminating the performing after an epitaxial growth material surface of a diamond shape is defined on a fin, wherein the separating includes etching for removal of oxide of an oxide layer over the bulk silicon substrate and etching for removal of material defining the fin, and wherein the further performing SEG includes further performing the SEG so that the epitaxial growth stressor connects to the bulk silicon substrate.

13. A semiconductor device comprising:
a bulk silicon substrate;
an oxide layer;
a fin extending from the bulk silicon substrate, the fin defining a source and drain, and a channel connecting the source and drain; and
a wrap around stressor comprising epitaxial growth material formed at an area of the fin defining one or more of the source or drain, the wrap around stressor wrapping 360 degrees around the area of the fin defining one or more of the source or drain.

14. The semiconductor device of claim 13, wherein the wrap around stressor connects to the bulk silicon substrate.

15. The semiconductor device of claim 13, wherein the wrap around stressor merges with a wrap around stressor of a neighboring fin.

16. The semiconductor device of claim 13, wherein the wrap around stressor induces compressive stress in the channel.

17. The semiconductor device of claim 13, wherein the wrap around stressor induces tensile stress in the channel.

18. The semiconductor device of claim 13, wherein semiconductor device includes means for inducing compressive stress in the channel.

19. The semiconductor device of claim 13, wherein semiconductor device includes means tensile stress in the channel.

20. The semiconductor device of claim 13, wherein the one or more of a source and drain includes a top bottom and sides and wherein the wrap around stressor wraps around the top, bottom and sides of the one or more of the source and drain.

* * * * *